(12) United States Patent
Saeki (10) Patent No.: US 10,218,328 B2
(45) Date of Patent: Feb. 26, 2019

(54) AUDIO PROCESSING APPARATUS FOR GENERATING AUDIO SIGNALS FOR MONITORING FROM AUDIO SIGNALS FOR RECORDING AND METHOD OF CONTROLLING SAME

(71) Applicant: CANON KABUSHIKI KAISHA, Tokyo (JP)

(72) Inventor: Takatoshi Saeki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/848,175

(22) Filed: Dec. 20, 2017

(65) Prior Publication Data

US 2018/0183399 A1 Jun. 28, 2018

(30) Foreign Application Priority Data

Dec. 26, 2016 (JP) .................................. 2016-251921
Oct. 6, 2017 (JP) .................................. 2017-196399

(51) Int. Cl.
| | | |
|---|---|---|
| *H03G 3/32* | (2006.01) | |
| *H03G 3/30* | (2006.01) | |
| *H04R 29/00* | (2006.01) | |
| *H03G 3/02* | (2006.01) | |
| *H03G 7/00* | (2006.01) | |

(Continued)

(52) U.S. Cl.
CPC ................ *H03G 3/32* (2013.01); *H03G 3/02* (2013.01); *H03G 3/3005* (2013.01); *H03G 7/002* (2013.01); *H04R 29/001* (2013.01); *H04R 1/1008* (2013.01); *H04R 1/1083* (2013.01);

(Continued)

(58) Field of Classification Search
CPC .......... H03G 3/32; H03G 3/3005; H03G 3/02; H03G 7/002; H04R 29/001; H04R 1/1008; H04R 1/1083; H04R 3/007; H04R 5/033; H04R 2430/01
See application file for complete search history.

(56) References Cited

U.S. PATENT DOCUMENTS 5,577,148 A * 11/1996 Kamatani ................ H04N 3/08
  348/164
2006/0164162 A1 * 7/2006 Dauphinee ........... H03G 3/3036
  330/141

(Continued)

FOREIGN PATENT DOCUMENTS

| GB | 1217491 A | 12/1970 |
|---|---|---|
| JP | 06-338746 A | 12/1994 |
| JP | 2004-104692 A | 4/2004 |

OTHER PUBLICATIONS

A European Search Report dated Jun. 15, 2018 that issued in the corresponding European Patent Application No. 1721199.6.

*Primary Examiner* — Mark Fischer
(74) *Attorney, Agent, or Firm* — Cowan, Liebowitz & Latman, P.C.

(57) ABSTRACT

An audio processing apparatus comprises a signal processing unit configured to process an input audio signal by applying a gain to the input audio signal to generate an audio signal for monitoring by a user. The signal processing unit is configured to increase the gain applied to the input audio signal, in a case where the audio signal for monitoring becomes low, in two stages by first increasing a gain applied to the audio signal at first rate during a first stage and subsequently increasing the gain applied to the audio signal at a second rate during a second stage.

13 Claims, 10 Drawing Sheets

(51) Int. Cl.
*H04R 1/10* (2006.01)
*H04R 3/00* (2006.01)
*H04R 5/033* (2006.01)

(52) U.S. Cl.
CPC .............. *H04R 3/007* (2013.01); *H04R 5/033* (2013.01); *H04R 2430/01* (2013.01)

(56) References Cited

U.S. PATENT DOCUMENTS

| | | |
|---|---|---|
| 2007/0223870 A1* | 9/2007 | Farling .................... H04N 5/76 386/278 |
| 2011/0153046 A1 | 6/2011 | Nagasue et al. |
| 2012/0275619 A1 | 11/2012 | Daishin et al. |
| 2013/0201272 A1* | 8/2013 | Enbom .................... H04N 7/15 348/14.01 |
| 2014/0185833 A1 | 7/2014 | Ikeda |
| 2016/0173808 A1 | 6/2016 | Reams |

\* cited by examiner

AUDIO PROCESSING APPARATUS FOR GENERATING AUDIO SIGNALS FOR MONITORING FROM AUDIO SIGNALS FOR RECORDING AND METHOD OF CONTROLLING SAME

BACKGROUND OF THE INVENTION

Field of the Invention

The present invention relates to an audio processing apparatus, and a method of controlling the same.

Description of the Related Art

A video camera is mounted with an audio processing apparatus for obtaining audio as well as video. It is know that control, such as ALC (automatic level control), for maintaining a level of recorded audio in an appropriate range is used in such an audio processing apparatus. In ALC, processing for suppressing audio by lowering the gain when the level of input audio is too large and amplifying the audio by raising the gain when the level of input audio is too small is performed (for example, Japanese Patent Laid-Open No. 2004-104692).

However, in the foregoing conventional example ALC is a counter-measure that is used independently. When a user monitors audio resulting from performing ALC processing on recorded audio for a purpose such as to protect the user's ears, there are cases where a level difference occurs between the recorded audio and monitoring audio, and a sense of unnaturalness arises in an acoustic sense.

SUMMARY OF THE INVENTION

According to an aspect of the present invention, there is provided an audio processing apparatus comprising a signal processing unit configured to process an input audio signal by applying a gain to the input audio signal to generate an audio signal for monitoring by a user, the signal processing unit being configured to increase the gain applied to the input audio signal, in a case where the audio signal for monitoring becomes low, in two stages by first increasing a gain applied to the audio signal at first rate during a first stage and subsequently increasing the gain applied to the audio signal at a second rate during a second stage.

Further features of the present invention will become apparent from the following description of exemplary embodiments (with reference to the attached drawings).

DESCRIPTION OF THE EMBODIMENTS

Hereinafter, embodiments according to the present invention will be explained in detail in accordance with the accompanying drawings.

First Embodiment

In this embodiment, explanation is given regarding an audio processing apparatus that is applied to an image capturing apparatus such as a video camera.

Figure 5:
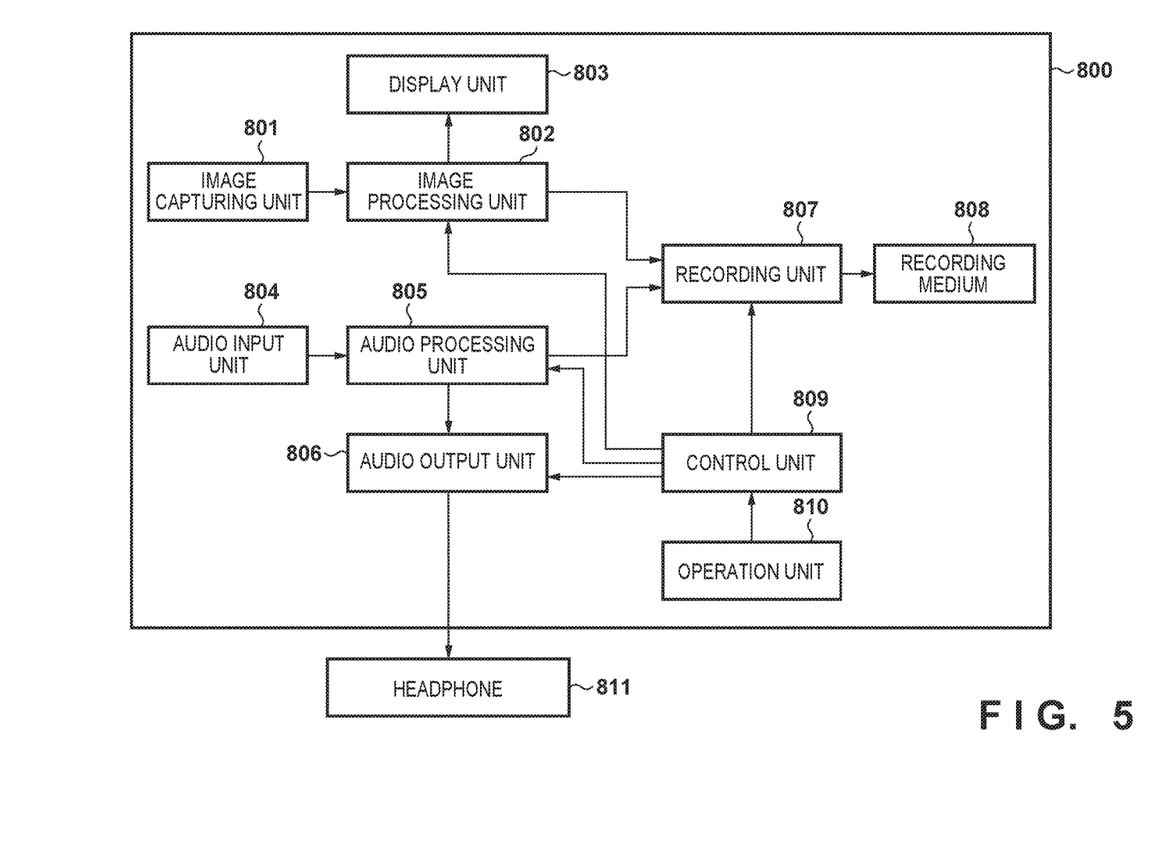
FIG. 5 is a block diagram of an image capturing apparatus.

FIG. 5 illustrates a block configuration diagram of an image capturing apparatus 800 that mainly relates to recording. An image capturing unit 801 in the image capturing apparatus 800 has an optical system such as a lens, an image capturing element, an AD converter, or the like, and repeatedly outputs a signal corresponding to an image formed on the image capturing element as image data. The image capturing unit 801 in this embodiment outputs a moving image at 30 frames/second for example. An image processing unit 802 performs processing necessary for display on a moving image signal from the image capturing unit 801, outputs a processing result to a display unit 803, and causes the display unit 803 to display the processing result. In addition, the image processing unit 802 compresses a moving image signal by a publicly known coding method such as MPEG, and outputs to a recording unit 807.

An audio input unit 804 has a microphone, an AD converter, or the like, sets audio (audio of a subject) from outside of the apparatus obtained by sampling as an audio signal, and outputs the digital audio signal to an audio processing unit 805. Note that the audio input unit 804 outputs a stereo audio signal that includes a right channel and a left channel. The audio processing unit 805 performs necessary processing such as gain control on the audio signal from audio input unit 804, and outputs to an audio output unit 806 and the recording unit 807. Note that, in a case of compressing and recording an audio signal, the audio processing unit 805 outputs to the recording unit 807 after performing compression processing on an audio signal for recording to which gain control processing has been performed. If an apparatus for audio monitoring such as a headphone 811 is connected to the exterior of the image capturing apparatus 800, the audio output unit 806 performs a D/A conversion on the digital audio signal for monitoring from the audio processing unit 805, and outputs it as an analogue signal to the headphone 811.

The recording unit 807 records a moving image signal for recording from the image processing unit 802 (encoded image data) and the audio signal for recording from the audio processing unit 805 (encoded audio data) in a recording medium 808 as one MPEG file, for example. The recording medium 808 is a non-volatile memory such as a memory card. The recording medium 808 is a form that can be attached/released with respect to the image capturing apparatus 800, but may be a configuration that is integrated in the image capturing apparatus 800.

A control unit 809 is provided with a CPU and a memory, and controls each unit of the image capturing apparatus 800 in accordance with a user instruction from an operation unit 810.

Here, operation of the image capturing apparatus 800 in this embodiment is explained. When the operation unit 810 is operated so that the power supply of the image capturing apparatus 800 is inputted, the control unit 809 controls each unit, and causes the image capturing apparatus 800 to transition to a recording standby state. In the recording standby state, output of an audio signal from the audio output unit 806 is caused to stop. In other words, even if a user connects the headphone 811 and is wearing it, it is not possible to listen to audio obtained by the audio input unit 804.

In the recording standby state, the image capturing unit 801 outputs the moving image signal to the image processing unit 802. The image processing unit 802 outputs the moving image signal from the image capturing unit 801 to the display unit 803, and the display unit 803 displays a moving image from the image capturing unit 801. When a user operates the operation unit 810 in this state and there is a recording start instruction, the control unit 809 controls each unit to start recording processing (transitions to a recording state).

In other words, the control unit 809 controls the image processing unit 802 to cause it to start processing for recording of the moving image signal from the image capturing unit 801. The image processing unit 802 performs processing for recording (including encoding) on the moving image signal from the image capturing unit 801, and outputs to the recording unit 807. In addition, the control unit 809 instructs the audio processing unit 805 to perform audio signal processing. The audio processing unit 805 performs processing that is described below on the audio signal from the audio input unit 804, and outputs an audio signal for recording to the recording unit 807.

In accordance with a recording start instruction from the control unit 809, the recording unit 807 records a moving image signal from the image processing unit 802 and an audio signal from the audio processing unit 805 in the recording medium 808. In addition, in accordance with a recording start instruction, the audio processing unit 805 outputs an audio signal for monitoring to the audio output unit 806. The audio output unit 806 outputs the audio signal for monitoring to an external monitoring apparatus such as the headphone 811.

When the operation unit 810 is operated and there is a recording stop instruction by a user after the start of recording, the control unit 809 controls each unit to stop recording the moving image signal and the audio signal to the recording medium 808, and cause a transition to the recording standby state.

Figure 1:
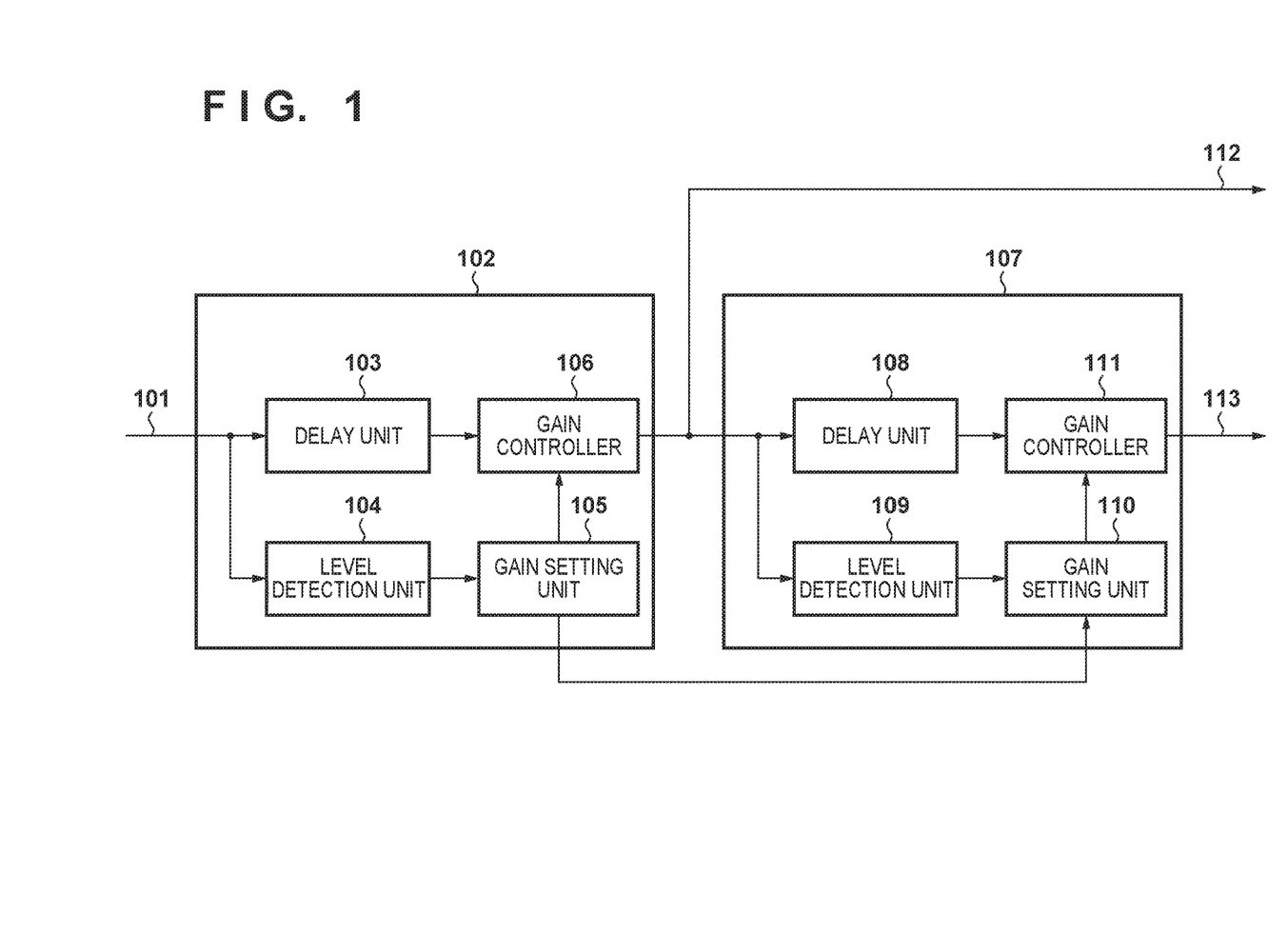
FIG. 1 is a block diagram for an audio processing unit in embodiments.

Next, explanation is given regarding gain control processing by the audio processing unit 805 on the digital audio signal. FIG. 1 is a block configuration diagram of a portion relating to gain control of an L channel, in the audio processing unit 805. An R channel, the other stereo channel, has a similar configuration and thus explanation thereof is omitted. Please understand that the following is an explanation for an audio signal of the L channel.

The level of a digital audio signal may be expressed in dBFS, which is decibels relative to full signal. In other words for a 16 bit digital signal, the maximum value is 32767 and the value of the digital signal (amplitude of the incoming audio wave) is indicated in decibels relative to that maximum value:

$$dBFS = 20 \log\left(\frac{A}{32767}\right)$$

Where A is the amplitude of the incoming digital signal.

In accordance with this notation, a maximum amplitude audio signal would have a value of 0 dBFS and a signal with 50% of maximum amplitude audio signal would have a value around −6 dBFS. For a 16 bit signal, dBFS varies between 0 and around −90.

As illustrated in FIG. 1, the audio processing unit 805 includes two audio signal processing circuits: an automatic level control (ALC) circuit for recording 102, and an ALC circuit for monitoring 107.

Detail will become clear from the explanation described below, but the ALC circuit for recording 102 and the ALC circuit for monitoring 107 in this embodiment operate as follows.

Explanation is given in detail below, in accordance with FIG. 1. An audio signal 101 from the audio input unit 804 is outputted to the ALC circuit for recording 102. The ALC circuit for recording 102 automatically performs gain control in accordance with the level of the input audio signal.

The ALC circuit for recording 102 has a delay unit 103 for delaying an input audio signal 101, a level detection unit 104 for detecting the level of the inputted input audio signal 101, and a gain setting unit 105 for setting a first gain in accordance with an output of the level detection unit 104. In addition, the ALC circuit for recording 102 has a gain controller 106 for performing gain control of the input audio signal 101 on the basis of the first gain set by the gain setting unit 105.

The ALC circuit for monitoring 107 is connected downstream of the ALC circuit for recording 102. The ALC circuit for monitoring 107 performs gain control on an audio signal for recording 112 outputted from the ALC circuit for recording 102.

The ALC circuit for monitoring 107 has a delay unit 108 for delaying the audio signal for recording 112, and a level detection unit 109 for detecting the level of the audio signal for recording 112. The ALC circuit for monitoring 107 has a gain setting unit 110 for setting a second gain in accordance with the first gain set in the gain setting unit 105 of the ALC circuit for recording 102, and an output from the level detection unit 109. In addition, the ALC circuit for monitoring 107 has a gain controller 111 for performing gain control on the audio signal for recording from the delay unit 108 on the basis of the second gain set by the gain setting unit 110.

The audio signal for recording 112 outputted from the ALC circuit for recording 102 is outputted to the recording unit 807 through an audio coding unit (not shown). In addition, an audio signal for monitoring 113 outputted from the ALC circuit for monitoring 107 is outputted to the audio output unit 806.

Figure 2A:
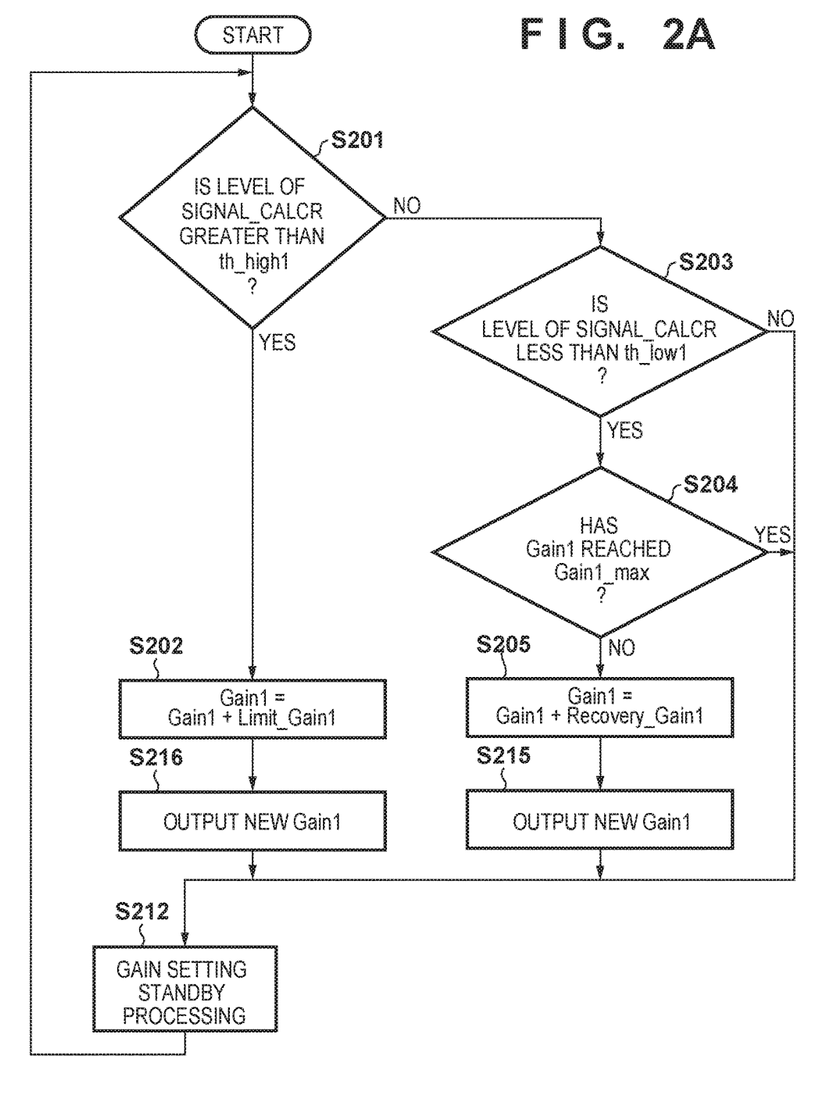
FIGS. 2A and 2B are flowcharts for gain control by the audio processing unit.
Figure 2B:
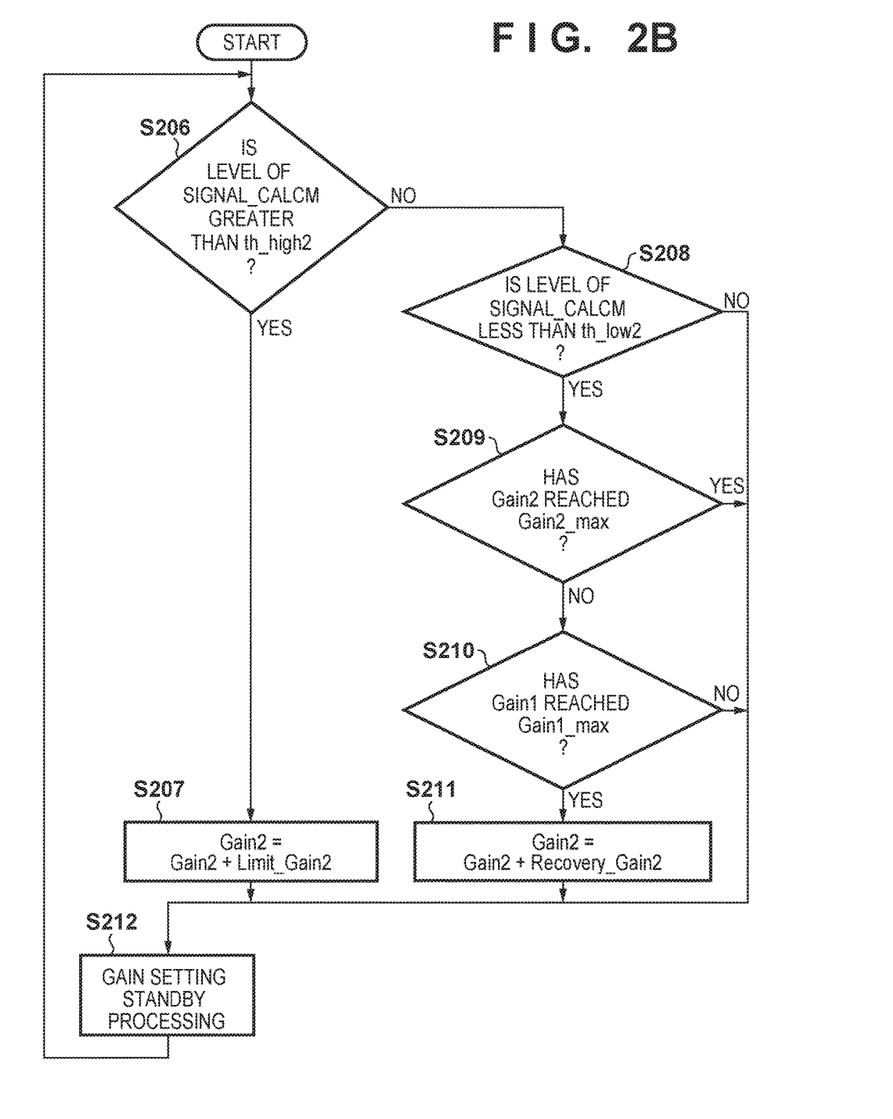

FIG. 2A is a flowchart illustrating processing for automatic gain control in the ALC for recording 102 in this embodiment. FIG. 2B is a flowchart illustrating processing for automatic gain control in the ALC for monitoring 107. The processing of FIGS. 2A and 2B is repeatedly executed every fixed interval for gain setting standby processing that is shown in step S212, during recording of an audio signal.

Looking at FIG. 2A, the ALC circuit for recording 102 controls the first gain based on the input audio signal 101 (an amplitude value obtained by envelope detection). Delay device 103 delays each sample of the inputted audio signal by a time period required for the envelope detection by the level detection unit 104. The ALC for recording 102 adjusts the first gain, Gain 1, based on an upper and lower limit values, th_high1 and th_low1. The ALC for monitoring 107 adjusts the second gain, Gain2, based on upper and lower limit values, th_high2 and th_low2. Note that a relationship between respective upper limit and lower limit values is as follows.

In the present embodiment, an upper limit value and a lower limit value are set as described below.

$$th\_high1(-2\ dBFs) > th\_high2(-6\ dBFs)$$

$$th\_low1(-3\ dBFs) > th\_low2(-12\ dBFs)$$

Note that each number is an example, and can be appropriately changed if the relationships of th_high1 (−2 dBFs)>th_high2, and th_low1 (−3 dBFs)>th_low2 are held.

To improve a SN ratio, it is desirable to record recorded audio at a level that is large enough so that the audio is not distorted (i.e. with a high peak signal). However, there is a high probability that audio this loud will damage the ears of a listener. The purpose of the ALC for monitoring 107 is, therefore, to apply a second negative gain (attenuation) which reduces the maximum signal value 113 that may be output by the ALC circuit for monitoring thereby protecting the ears of the listener from excessive volumes. A detailed processing procedure is as follows.

The level detection unit 104 detects the level of the input audio signal 101, and outputs the detected level to the gain setting unit 105. In step S201, the gain setting unit 105 calculates an audio level for recording, Signal_calcR, by applying a gain, Gain1, to the input signal, signal_input, detected by the level detection unit 104. The gain setting unit 105 determines whether the calculated audio level, Signal_calcR, for recording is higher than the upper limit value th_high1.

$$Signal\_calcR = signal\_input + Gain1$$

If the calculated audio level for recording, signal_calcR, is higher than the upper limit value, th_high1, then the signal to be recorded is relatively loud and there is a need to decrease the gain. In this case, the gain setting unit 105 updates as follows the value of Gain1 set immediately prior for the gain controller 106 of the ALC circuit for recording 102 (S202).

$$Gain1 = Gain1 + Limit\_Gain1$$

Here, Limit_Gain1 is a gain added to decrease the gain, Gain1, of the ALC circuit for recording 102, and the value of Limit_Gain1 is negative. When there is a need to decrease the gain, because there is a high probability that the level of the signal will get large and distort, it is preferential to decrease the gain by as fast (or short) a time constant as possible. Specifically, in a case of making the time constant fast when causing the gain to change, the amount of the gain, Limit_Gain1, that changes each time is set to be large, for example. Conversely, when the time constant is set to be slow (or long), the amount of the gain, Limit_Gain1, that changes each time is made to be small. In addition, for example, when the time constant is made to be fast when causing the gain to change, an interval for changing Limit_Gain1 is made to be small. For example, Limit_Gain1 is changed every two samples of an inputted audio signal. In such a case, the amount of Limit_Gain1 that is changed each time is made to be constant. In addition, when the time constant is made to be slow, an interval for changing Limit_Gain1 is lengthened. For example, Limit_Gain1 is changed every eight samples of an inputted audio signal. When there is no need to make the time constant fast or slow, Limit_Gain1 is changed every four samples of the inputted audio signal, for example.

After the gain changes in step S202, the processing proceeds to S216 in which the change in Gain1 is communicated to the gain setting unit 110 of the ALC for monitoring 107. After step S216, the processing returns to steps S212 and S201, and step S202 and S216 and S212 are repeated until the level of the calculated audio level, Signal_calcR, becomes smaller than th_high1.

In a case where it is determined in step S201 that the calculated audio level for recording is not larger than the upper limit value, th_high1, the gain setting unit 105 advances the processing to step S203 and determines whether the calculated audio level for recording, signal_calcR, is lower than the lower limit value, th_low1. When the calculated audio level for recording, Signal_calcR, is lower than the lower limit value, th_low1, there is a need to increase the gain and processing advances to S204. Meanwhile, when it is determined in step S203 that the calculated audio level for recording is not less than the lower limit value, th_low1, because the level is restrained to an appropriate level, the gain setting unit 105 does not change the value of the gain of the gain controller 106.

Subsequently, in step S204, a determination is made as to whether the level of Gain1 of the ALC for recording has reached a maximum value set for the ALC for recording, Gain1_max.

A recovery gain is a gain for increasing the level for an inputted audio signal. When the value of Gain1 is made too large, even a quiet environmental sound would be heard as loud and the audio to actually be recorded will become hard to hear, so a maximum value in each ALC is defined as a set value (Gain1_max, Gain2_max).

When the determination of step S204 indicates that the level of Gain1 has not reached Gain1_max, the gain setting unit 105 updates, as follows, the value of the gain Gain1 set in the gain controller 106 of the ALC circuit for recording 102 (step S205).

$$Gain1 = Gain1 + Recovery\_Gain1$$

Here, Recovery_Gain1 is a gain added to increase the gain, Gain1, of the ALC circuit for recording 102, and the value of Recovery_Gain1 is positive. When there is a need to increase the gain, it is preferable to raise the gain by as slow a time constant as possible, so that the change of the level is not perceived (does not stand out). Specifically, how the time constant for changing Recovery_Gain1 is changed is similar to when Limit_Gain1 is changed. Therefore, it is possible to independently set the time constant for when changing Limit_Gain1 and Recovery_Gain1.

After S205 is step S215 in which the change in Gain1 is communicated to the gain setting unit 110 of the ALC for monitoring 107.

Next, processing in the ALC circuit for monitoring 107, which is part of the audio processing unit 805, is described in connection with FIG. 2B.

The level detection unit 109 detects the level of the audio signal for recording outputted from the gain controller 106, and outputs the detected level to the gain setting unit 110. In step S206, the gain setting unit 110 calculates an audio level for monitoring, Signal_calcM, by applying a gain, Gain2, to the input signal detected by the level detection unit 109.

$$Signal\_calcM = signal\_input + Gain2$$

In step S206, the gain setting unit 110 determines whether the calculated audio level for monitoring, Signal_calcM, is higher than the upper limit value, th_high2. If the calculated audio level for monitoring, Signal_calcM, is higher than the upper limit value, th_high2, then there is a need to decrease the gain. Therefore, the gain setting unit 110 updates as follows, the value of the Gain2 set immediately prior for the gain controller 110 of the ALC circuit for monitoring (S207).

Gain2=Gain2+Limit_Gain2

Here, Limit_Gain2 is a gain added to decrease the gain Gain2 of the ALC circuit for monitoring 107, and the value of Limit_Gain2 is negative. When there is a need to decrease the gain, it is preferential to decrease the gain by as fast a time constant as possible. Specifically, how the time constant for changing Limit_Gain2 is changed is similar to when Limit_Gain1 is changed.

Meanwhile, if the calculated audio level Signal_calcM is not greater than the upper limit value, th_high2, the gain setting unit 110 advances the processing to step S208, and determines whether the calculated audio level for monitoring, Signal_calcM, is less than the lower limit value th_low2. When it is determined that the calculated audio level for monitoring, Signal_CalcM, is not less than the lower limit value th_low2, the level of the audio signal outputted by the ALC circuit for monitoring 107 is between the upper limit value th_high2 and the lower limit value th_low2 and is an appropriate level. Therefore, the gain setting unit 110 does not change the value of the gain of the gain controller 111.

When it is determined in step S208 that the calculated audio level for monitoring, Signal_CalcM, is less than the lower limit value, th_low2, the gain setting unit 110, in step S209, confirms whether the level of Gain2 has reached a maximum value, Gain2_max for the ALC for monitoring, and does not change the value of the gain when the level has reached Gain2_max for the ALC for monitoring. Subsequently, in step S210, it is determined whether the gain level, Gain1, of the ALC circuit for recording 102 outputted from the gain setting unit 105 has reached the maximum value, Gain1_max, for the ALC for recording. When the level of Gain1 has not reached the maximum value for the ALC for recording, the value of the gain, Gain2, of the gain controller 111 is not changed. When the gain of the ALC circuit for recording, Gain1, has reached the maximum value, Gain1_max, the gain setting unit 110 advances the processing to step S211, and updates the gain Gain2 as follows.

Gain2=Gain2+Recovery_Gain2

Here, Recovery_Gain2 is a gain added to increase the gain, Gain2, of the ALC circuit for monitoring 107, and the value of Recovery_Gain2 is a positive number.

In step S211, gain control is changed only for monitoring audio and does not affect recorded audio, so, when increasing the gain Gain2 of the ALC circuit for monitoring 107, it is desirable to perform change so that change in terms of acoustic sense is not perceived. Accordingly, when increasing the gain Gain2, it is desirably to increase the gain by a slower time constant than for the gain Gain1 for the ALC for recording. In other words, the value of Recovery_Gain2 is set lower than the value of Recovery_Gain1. Specifically, how the time constant for changing Recovery_Gain2 is changed is similar to when Limit_Gain1 is changed. Therefore, it is possible to independently set the time constant for when changing Recovery_Gain2 and Recovery_Gain1.

Figure 3:
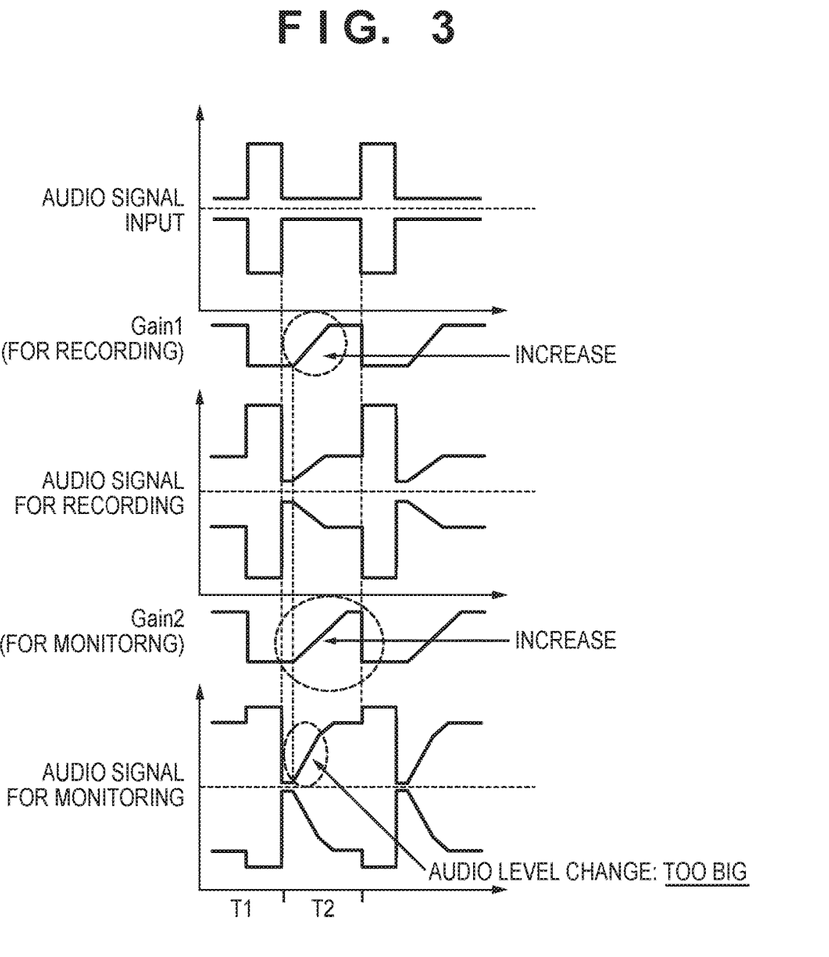
FIG. 3 is a view illustrating audio signal levels.
Figure 4:
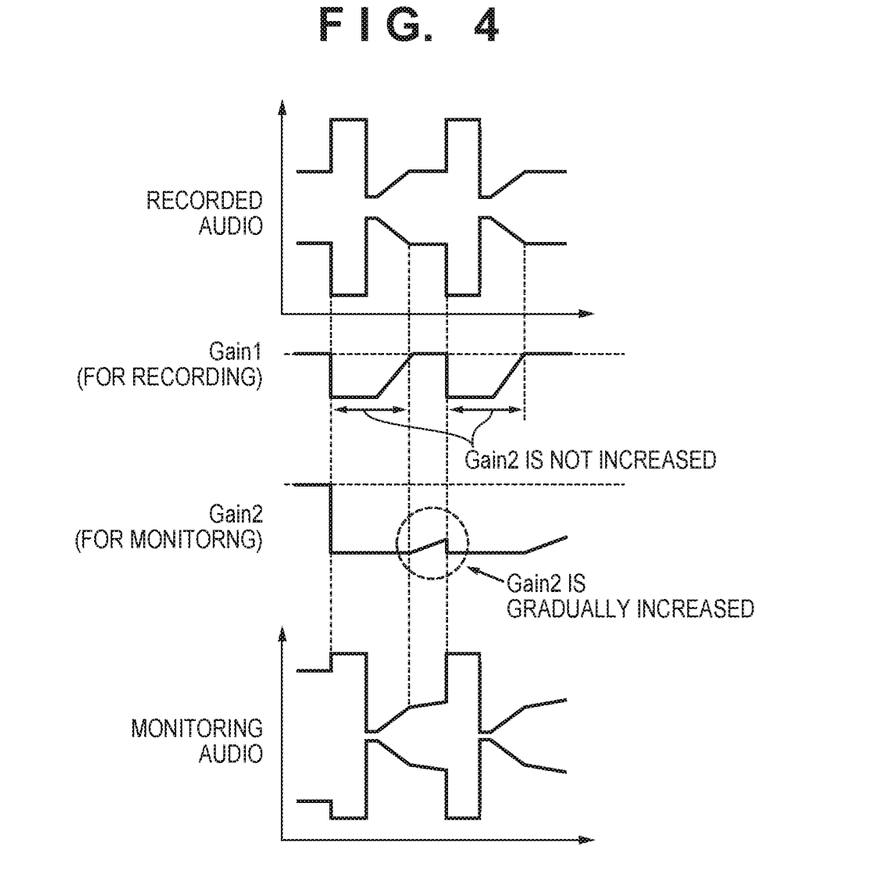
FIG. 4 is a view illustrating audio signal levels.

An example of the output of the audio processing unit 805 is now explained and variation of levels for recorded audio and monitoring audio is as shown in FIG. 4. FIG. 4 is a view that illustrates levels of the monitoring audio 113, the audio signal for recording 112, and the input audio signal 101 with the configuration of FIG. 1. In addition, FIG. 3 is a view that illustrates level variation for a circuit that does not embody the invention. In particular the case is considered in which the steps S216, S215, and S210 are not performed and there is no feedback between the gain setting unit 105 and the gain setting unit 110. In this illustrative case, the gain of the ALC circuit for monitoring is controlled only on the basis of the level of the audio signal for recording inputted to the ALC circuit for monitoring from the ALC circuit for recording.

In FIG. 3, the audio input graph shows the envelope of an audio signal oscillating about a zero value illustrated by the horizontal dashed line. For the sake of illustration of the properties of the circuit the amplitude of the envelope changes rapidly in a step-like manner. The response during the period T1 to T2 will particularly be described. The audio input signal changes from a high amplitude to a low amplitude. The gain setting unit 105 adjusts the audio input signal level by Gain 1 and identifies that the signal value for recording has fallen below the value, Th_low1. In response to this determination, Gain1 starts to increase gradually until it reaches Gain1_max. This is reflected in the output audio signal for recording.

The operation of the ALC for monitoring is now described. The input audio signal from the ALC for recording is adjusted by Gain 2 and the signal value for monitoring is determined and is found to be below the value Th_low2. Accordingly, the value Gain2 also starts increasing. The effect on the audio signal for monitoring is shown. It can be seen that in this example (with no feedback between the ALC circuits), the combined increase in the signal level for monitoring is sharp, which may seem unnatural to the user. This is caused by both the ACL for recording and the ALC for monitoring simultaneously adjusting the gain values, Gain1 and Gain2.

Consequently, as illustrated in FIG. 4, the effect of the circuit arrangement previously described as the first embodiment is illustrated. In response to the same input audio, the ALC for recording 102 operates in the same way. The gain, Gain1, is gradually increased. However, in step S210 it is initially determined that Gain1 has not reached Gain1_max. This prevents Gain2 from increasing while Gain1 is increasing. In view of this, the overall gain in the monitoring audio increases more gradually. Therefore, the level of audio for monitoring changes in conformance with the recorded audio, and it is possible to reduce a sense of unnaturalness in an acoustic sense of the audio for monitoring.

Second Embodiment

Figure 6:
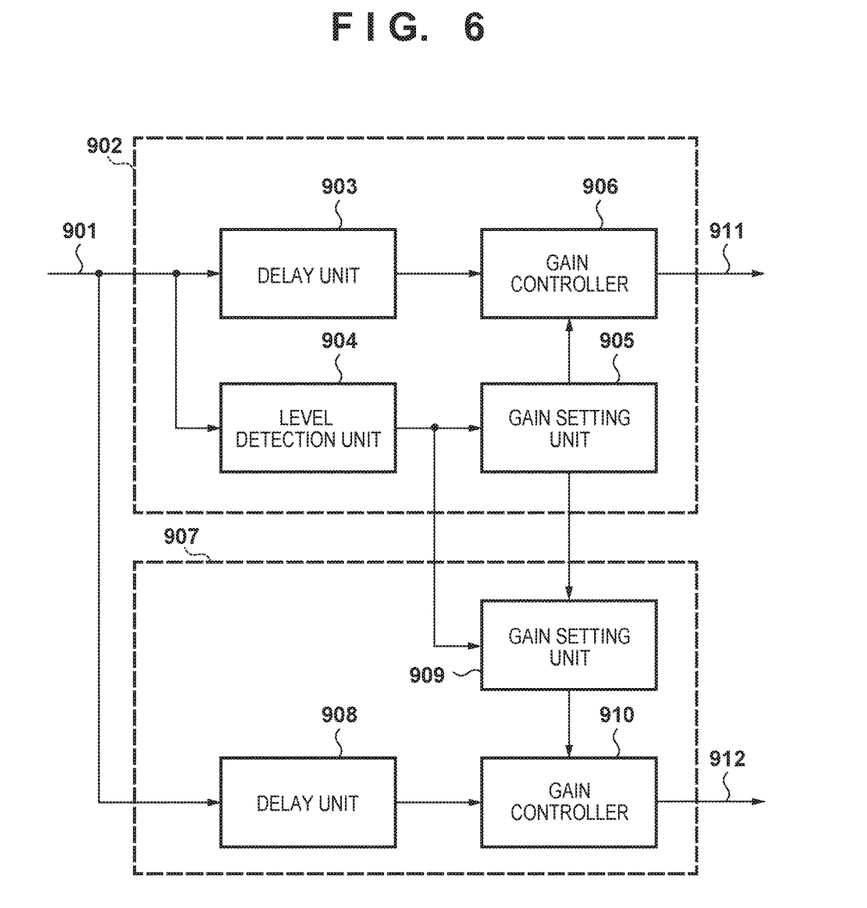
FIG. 6 is a block diagram for an audio processing unit in a third embodiment.

In the first embodiment, the ALC for recording and the ALC for monitoring were arranged in series, but, in the second embodiment, explanation is given regarding a configuration in which an ALC for recording and an ALC for monitoring are arranged in parallel, as in FIG. 6. Note that, in the second embodiment explanation is also given that focuses only on an L channel, but it should be understood that there is a similar configuration for the R channel.

Explanation is given in detail below, in accordance with FIG. 6. An audio signal 901 is output to an ALC circuit for recording 902 and an ALC circuit for monitoring 907. The ALC circuit for recording 902 and the ALC circuit for monitoring 907 automatically perform gain control in accordance with the level of the input audio signal.

The ALC circuit for recording 902 has a delay unit 903 for delaying the input audio signal 901, a level detection unit 904 for detecting the level of the input audio signal 901, and a gain setting unit 905 for setting a gain, Gain2, based on a calculated signal level for recording, Signal_calcR. In addition, the ALC circuit for recording 902 has a gain controller 906 for performing gain control of an input audio signal from the delay unit 903 on the basis of the gain set by the gain setting unit 905.

The ALC circuit for monitoring 907 has a delay unit 908 for delaying the input audio signal 901. With this configuration, because a level detection result in the ALC circuit for recording is the same as a level detection result in the ALC circuit for monitoring, there is no need to have a level detection unit in the ALC circuit for monitoring 907 if the detection result from the level detection unit 904 of the ALC circuit for recording can be obtained. The ALC circuit for monitoring 907 has a gain setting unit 909 for setting a gain, Gain2, in accordance with a gain, Gain1, set in the gain setting unit 905 of the ALC circuit for recording 902 and an output from the level detection unit 904 of the ALC circuit for recording 902. In addition, the ALC circuit for monitoring 907 has a gain controller 910 for performing gain control on the audio signal for recording from the delay unit 908 on the basis of the gain set by the gain setting unit 909.

Figure 7A:
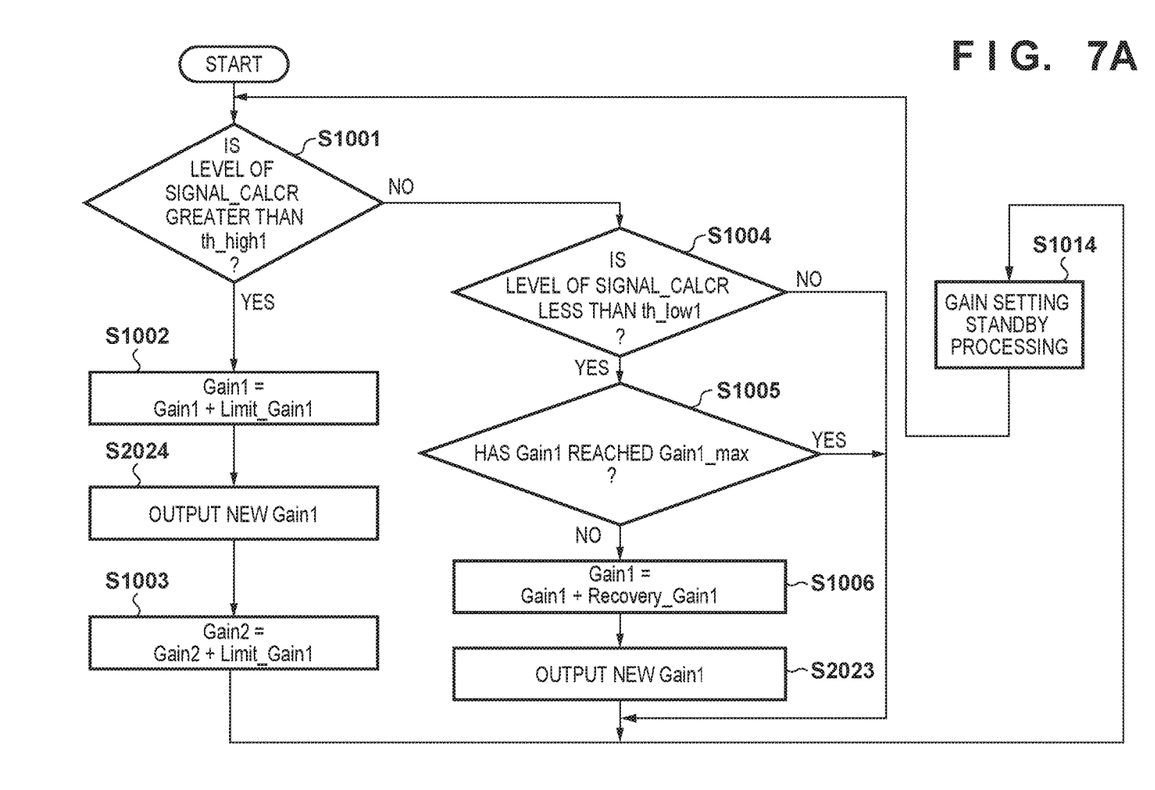
FIGS. 7A and 7B are flowcharts illustrating gain control by an audio processing unit.
Figure 7B:
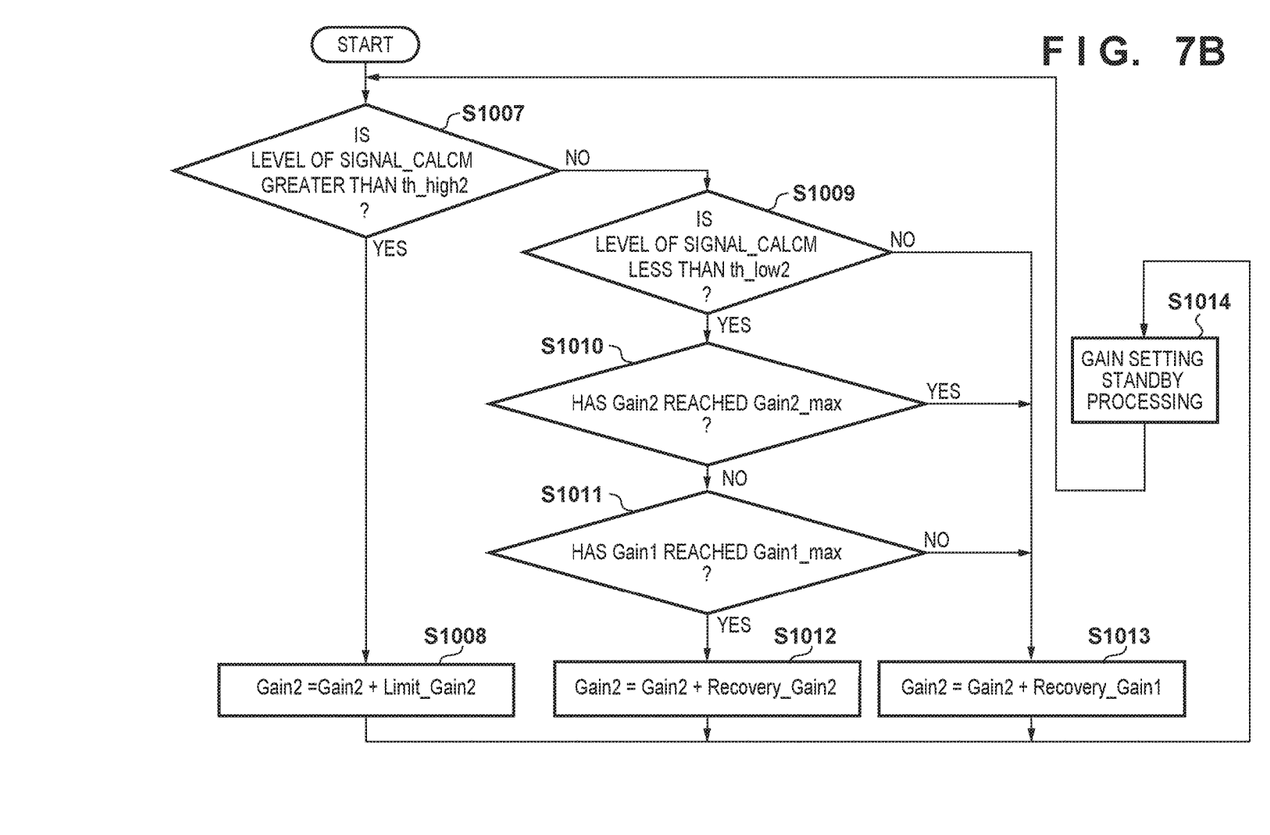

FIGS. 7A and 7B are flowcharts illustrating processing for automatic gain control in the audio processing unit 805 in this embodiment. FIG. 7A shows the processing performed by the ALC for recording 902 and FIG. 7B shows the processing performed by the ALC for monitoring 907. The processing of FIGS. 7A and 7B is repeatedly executed every fixed interval for gain setting standby processing that is defined in step S1014, during recording of an audio signal.

Consideration for the upper limit value th_high1 and the lower limit value th_low1 of the ALC circuit for recording 902 is the same as in the first embodiment, and is thus omitted.

The level detection unit 904 detects the level of the input audio signal 901, and outputs the detected level to the gain setting unit 905. In step S1001, the gain setting unit 905 determines whether the audio signal for recording Signal_CalcR, obtained by applying Gain1 to the detected level of the input audio signal as described in the first embodiment, is higher than the upper limit value th_high1. If the audio signal for recording detected by the level detection unit 904 is higher than the upper limit value th_high1, there is a need to decrease the gain. Therefore, the gain setting unit 905 updates, as follows, the value of a gain, Gain1, set immediately prior for the gain controller 906 of the ALC circuit for recording 902 (step S1002).

Gain1=Gain1+Limit_Gain1

At this point, the new gain values are communicated to the gain setting unit 909 in S2024. In step S1003 the gain setting unit 909 changes Gain2 by the same gain amount as the gain change amount for the ALC for recording is also performed for the ALC for monitoring, so that it is possible to confirm the gain change for the recorded audio by the monitoring audio (step S1003).

Gain2=Gain2+Limit_Gain1

Here, Limit_Gain1 is a gain added to decrease the gain Gain1 of the ALC circuit for recording 902 and the gain Gain2 of the ALC circuit for monitoring 907, and the value of Limit_Gain1 is negative. When there is a need to decrease the gain, because there is a high probability that the level of the signal will get large and distort, it is preferential to decrease the gain by as fast a time constant as possible.

After the gain changes in step S1002 and step S1003, the processing returns to step S1001, and step S1002 and step S1003 are repeated until the level of the calculated signal for recording, Signal_CalcR, becomes smaller than th_high1.

The processing of step S1004 through step S1006 and S2023 in the case where it is determined in step S1001 that the value of the calculated signal for recording, Signal_CalcR, is not larger than the upper limit value th_high1 is the same as the processing of step S203 through step S205 and S215 of the first embodiment, and is thus omitted.

Next, referring to FIG. 7B, the processing of step S1007 and later is processing by the ALC circuit for monitoring 907.

The level detection unit 904 detects the level of the input audio signal, and outputs the detected level to the gain setting unit 909. In step S1007, the gain setting unit 909 determines whether the calculated level of the audio signal for monitoring, Signal_CalcM, calculated in the same way as described in the first embodiment is greater than the upper limit value th_high2. If the level detected by the level detection unit 904 is greater than the upper limit value th_high2, the gain is still high from the perspective of ear protection, there is a need to further reduce the gain despite the gain having been decreased once in step S1003. Therefore, the gain setting unit 909 updates as follows the value of the gain Gain2 set immediately prior for the gain controller 910 of the ALC circuit for monitoring 907 (step S1008).

Gain2=Gain2+Limit_Gain2

Here, Limit_Gain2 is a gain added to decrease the gain Gain2 of the ALC circuit for monitoring 907, and the value of Limit_Gain2 is negative. When there is a need to decrease the gain, because there is a high probability that the level of the signal will get large and distort, it is preferential to decrease the gain by as fast a time constant as possible. Specifically, how the time constant for changing Limit_Gain2 is changed is similar to when Limit_Gain1 is changed.

Meanwhile, if the calculated value of the audio signal for monitoring, Signal_CalcM, is not greater than the upper limit value th_high2, the gain setting unit 909 advances the processing to step S1009, and determines whether the calculated value of the audio signal for monitoring is less than the lower limit value th_low2. When it is determined that the calculated value of the audio signal for monitoring is not less than the lower limit value th_low2, the level of the audio signal inputted to the ALC circuit for monitoring 907 is an appropriate level. Therefore, the gain setting unit 909 does not change the value of the gain, Gain2, of the gain controller 910.

When it is determined in step S1009 that the calculated value of the audio signal for monitoring is less than the lower limit value th_low2, the gain setting unit 909, in step S1010, confirms whether the level of the gain, Gain2, of the ALC for monitoring has reached the a maximum value, Gain2_max, for the ALC for monitoring, and does not change the value of the gain when the level has reached the Gain2_max for the ALC for monitoring. Subsequently, in step S1011, it is determined whether the level of the gain of the ALC circuit for recording 102, Gain1, outputted from the gain setting unit 905 has reached a maximum value for the ALC for recording, Gain1_max, and when Gain1 has not reached Gain1_max the gain setting unit 909 causes the gain Gain2 of the ALC circuit for monitoring 907 to change by the same gain as for the gain controller for recording 906 (step S1013) received in step S2023.

Gain2=Gain2+Recovery_Gain1

When the gain Gain1 of the ALC circuit for recording 902 has reached Gain1_max, the processing advances to step S1012, and updates the gain Gain2 as follows.

Gain2=Gain2+Recovery_Gain2

Here, Recovery_Gain2 is a gain added to increase the gain Gain2 of the ALC circuit for monitoring 907, and the value of Recovery_Gain2 is a positive number.

Gain control in step S1013 is for confirming the recorded audio, and thus, when the gain Gain2 of the ALC circuit for monitoring 907 is increased, it is caused to change by the same gain amount (Recovery_Gain1) as in step S1006.

In contrast, gain control in step S1012 is change only for monitoring audio and does not affect recorded audio, so, when increasing the gain Gain2 of the ALC circuit for monitoring 907, a change that is not acoustically perceived is desirable. In other words, the value of Recovery_Gain2 is set lower than the value of Recovery_Gain1.

Figure 8:
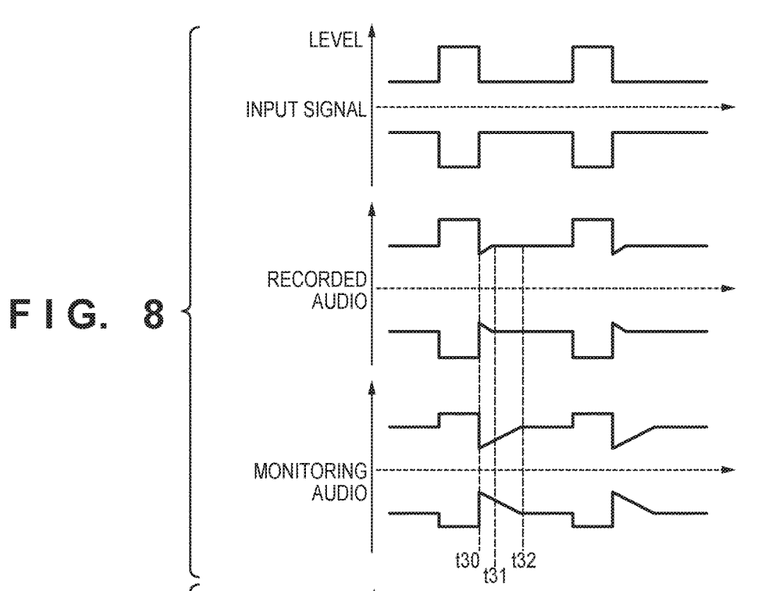
FIG. 8 is a view illustrating audio signal levels.
Figure 9:
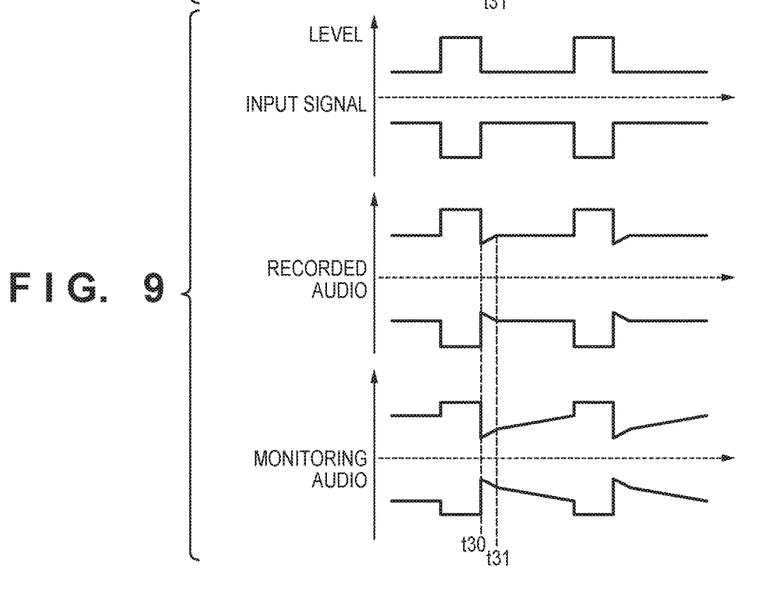
FIG. 9 is a view illustrating audio signal levels.

In such a case, variation of levels for recorded audio and monitoring audio is as in FIG. 9. FIG. 9 is a view that illustrates levels of the monitoring audio 912, the recorded audio 911, and the input audio signal 901 with the configuration of FIG. 9. In addition, FIG. 8 is a view that illustrates level variation for a circuit arrangement that does not embody the invention. In particular, it illustrates the circuit response of an ALC monitoring circuitry in parallel without any feedback between the ALC for recording and the ALC for monitoring. In this case the gain of the ALC circuit for monitoring is controlled on the basis of just the level of the audio signal inputted to the ALC circuit for monitoring and both the recorded and monitored signals raise linearly in accordance with operation of the respective ALC circuit.

In FIG. 8, the level of monitoring audio increases to a constant level in the time period from the timing t30 to t32, but because when a gain change is actually performed in the recorded audio is a short time period from t30 to t31, a sense of unnaturalness in an acoustic sense occurs. In contrast, in accordance with the embodiment, because the gain smoothly increases after the gain of the ALC circuit for recording 902 has reached the set value (from t31), gain change of the audio for recording is easy to discern, and it is possible to reduce a sense of unnaturalness in an acoustic sense for the audio for monitoring.

Other Embodiments

The first embodiment describe a situation in which the ALC for recording increases the first gain, Gain1, and subsequently the ALC for monitoring increases the second gain, Gain2. However, in other embodiments, the ALC for monitoring could vary the rate at which it increases Gain2 in dependence upon the behavior of the ALC for recording. For example, the ALC for monitoring might increase Gain2 more slowly until Gain1 reaches Gain1_max, so that the overall effect on the audio for monitoring is still not too unnatural.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2016-251921 filed Dec. 26, 2016, and No. 2017-196399 filed Oct. 6, 2017, which are hereby incorporated by reference herein in their entirety.

What is claimed is:

1. An audio processing apparatus comprising a first audio signal processing circuit and a second audio processing circuit,
    wherein the first audio signal processing circuit generates audio signals for recording by controlling a gain of audio signals from a microphone and outputs the audio signals for recording, and
    wherein the second audio signal processing circuit generates audio signals for monitoring by a user independently from the audio signals for recording, by performing a gain control for the audio signals for recording from the first audio signal processing circuit, the second audio signal processing circuit comprising:
    a gain setting circuit which sets the gain by detecting amplitude level of the audio signals for recording from the first audio signal processing circuit; and
    a gain controller which performs gain controlling based on the gain set by the gain setting circuit, to generate audio signals for monitoring from the audio signal for recording,
    wherein the gain setting circuit acquires the gain that the first audio processing circuit sets currently, and determines the gain of the audio signals for monitoring based on the gain currently set in the first audio signal processing circuit and the amplitude level of audio signals for recording from the first audio signal processing circuit.

2. An audio processing apparatus according to claim 1, wherein the gain setting circuit
    when the amplitude level of the audio signals for recording from the first audio signal processing circuit is greater than a higher limit of a predetermined range for monitoring, decreases the gain for the audio signals for monitoring,
    when the amplitude level of the audio signals for recording is less than a lower limit of the predetermined range for monitoring and the gain currently set in the first audio signal processing circuit has reached to a predetermined gain, increases the gain for the audio signals for monitoring, and otherwise, keep currently set gain for the audio signals for monitoring.

3. An audio processing apparatus according to claim 1, wherein the gain setting circuit determines a time constant for the gain.

4. An audio processing apparatus according to claim 3, wherein the first audio signal processing circuit and second audio signal processing circuit are configured in series so that the second audio signal processing circuit is configured to receive the audio signal for recording from the first audio signal processing circuit.

5. An audio processing apparatus according to claim 4, wherein the first audio signal processing circuit is configured so that, in response to the audio signals from the microphone falling below a first lower limit of a predetermined range for recording, the first audio signal processing circuit increases a first gain applied to the audio signals to generate the audio signal for recording thereby increasing the gain during the first stage at a first rate and the second audio signal processing circuit, in response to the audio signal for recording falling below a second lower limit of the predetermined range for monitoring and the first gain currently set in the first audio signal processing circuit has reached the predetermined gain, increases a second gain applied to the audio signal for recording to generate the audio signal for monitoring, thereby increasing the gain in the second stage at the second rate following the first stage.

6. An audio processing apparatus according to claim 5, wherein the first lower limit is a higher signal level than the second lower limit.

7. An audio processing apparatus according to claim 3, wherein the first audio signal processing circuit and second audio signal processing circuit are configured in parallel such that audio signal processing circuit is configured to receive the input audio signal.

8. An audio processing apparatus according to claim 7, wherein the first audio signal processing circuit is configured so that, in response to the audio signal for recording falling below a first lower threshold value, the first audio signal processing circuit increases a first gain applied to the input audio signal to generate the audio signal for recording and the second audio signal processing circuit is configured to increase a second gain during the first stage at the same rate as the increase in the first gain applied to the audio signal for recording by the first audio signal processing circuit thereby increasing the gain for monitoring during the first stage at a first rate, and the second audio signal processing circuit is configured to, in response to the audio signal for monitoring falling below a second lower threshold, subsequently increase the second gain after increase of the second gain during the first stage is complete, thereby increasing the second gain in the second stage.

9. An audio processing apparatus according to claim 1, wherein the second audio signal processing circuit is configured to communicate with the first audio signal processing circuit so that the second audio signal processing circuit can adjust the second gain subsequently to the first audio signal processing circuit.

10. An audio processing apparatus according to claim 1, wherein the first and second audio signal processing circuits are configured to perform processing on a digital audio signal.

11. An audio processing apparatus according to claim 1, further comprising an audio output terminal for connecting a headphone so that the user monitors the audio signal for monitoring.

12. An audio processing apparatus according to claim 1, further comprising a recording unit configured to record the audio signal for recording on a storage medium.

13. An audio processing method that processes an input audio signal by applying a gain to the input audio signal to generate an audio signal for monitoring by a user, the method comprising:

generating and outputting audio signals for recording in a first audio signal processing circuit by controlling a gain of audio signals from a microphone, generating audio signals for monitoring by a user independently from the audio signals for recording, by performing, in a second audio signal processing circuit, a gain control for the audio signals for recording from the output signals of the first audio signal processing circuit;

setting a gain in a gain setting circuit of the second audio processing circuit by detecting amplitude level of the generated audio signals for recording from the first audio signal processing circuit; and performing gain control by a gain controller of the second audio processing circuit based on the gain set by the gain setting circuit; and generating audio signals for monitoring from the audio signal for recording, wherein the gain setting circuit acquires the gain that the first audio processing circuit sets currently, and determines the gain of the audio signals for monitoring based on the gain currently set in the first audio signal processing circuit and the amplitude level of audio signals for recording from the first audio signal processing circuit.

* * * * *